United States Patent
Micciche

(10) Patent No.: US 7,828,031 B2
(45) Date of Patent: Nov. 9, 2010

(54) APPARATUS AND METHOD FOR ALIGNING AND FIXING RIBBON ON A SOLAR CELL

(75) Inventor: Brian S. Micciche, York, PA (US)

(73) Assignee: Komax Holding AG, Dierikon (CH)

( * ) Notice: Subject to any disclaimer, the term of this patent is extended or adjusted under 35 U.S.C. 154(b) by 1274 days.

(21) Appl. No.: 11/353,142

(22) Filed: Feb. 14, 2006

(65) Prior Publication Data
US 2006/0219352 A1 Oct. 5, 2006

Related U.S. Application Data

(60) Provisional application No. 60/654,004, filed on Feb. 18, 2005.

(51) Int. Cl.
*B32B 37/00* (2006.01)

(52) U.S. Cl. .......... 156/517; 156/538; 156/556

(58) Field of Classification Search ........ 156/510, 156/516, 517, 521, 538, 539, 556
See application file for complete search history.

(56) References Cited

U.S. PATENT DOCUMENTS

| 5,084,107 | A | 1/1992 | Deguchi et al. |
| 5,735,967 | A | 4/1998 | Yakou et al. |
| 2003/0127124 | A1 | 7/2003 | Jones et al. |

FOREIGN PATENT DOCUMENTS

| EP | 0095843 | 12/1983 |
| JP | 2000-022188 | 1/2000 |
| JP | 2004-111464 | 4/2004 |
| WO | WO 03059570 | 7/2003 |

OTHER PUBLICATIONS

Nowlan J J; et al.; Advanced Automation Techniques for Interconnecting Thin Silicon Solar Cells; World Conference on Photovoltaic Energy, Waikoloa, May 12, 1994; conferencia 1; pp. 828-831; 5175988 Inspec.
Spanish Search Report dated Aug. 26, 2008, Spanish Application No. 200600345.

*Primary Examiner*—James Sells
(74) *Attorney, Agent, or Firm*—Venable LLP; Jeffri A. Kaminski; Ryan M. Flandro

(57) ABSTRACT

An apparatus and a method are proposed for aligning and fixing a ribbon onto the groove of a solar cell for avoiding undue stress on the ribbon as well as crystal damage of the solar cells by hardening of the ribbon. The apparatus includes a frame, a leading arm, and a trailing arm, the leading and trailing arms being movably mounted on at least one linear guide arranged on said frame. The apparatus further provides for upward and downward movement of the at least one linear guide, and a shear for cutting said ribbon. Both the leading arm and the trailing arm have a gripper for gripping the ribbon. These grippers are provided to apply a predetermined longitudinal tension to the ribbon when the leading and trailing arms are moved relative to one another.

2 Claims, 6 Drawing Sheets

APPARATUS AND METHOD FOR ALIGNING AND FIXING RIBBON ON A SOLAR CELL

CROSS-REFERENCE TO RELATED APPLICATIONS

This Application claims the benefit under Title 35, United States Code, §119(e) of U.S. Provisional Application No. 60/654,004, filed Feb. 18, 2005, the subject matter of which is incorporated herein by reference.

BACKGROUND OF THE INVENTION

1. Field of the Invention

This invention relates to an apparatus and method for aligning and fixing a ribbon on a solar cell in order to facilitate forming a solar panel typically comprising several solar cells. In particular, the invention is related to such an apparatus and method, wherein the ribbon is a pre-tinned metal ribbon. Furthermore, the invention is related to a solar cell on which an above-mentioned ribbon is fixed.

2. Related Art

In the Photovoltaic industry, crystalline solar panels are made by interconnecting individual solar cells together in a line to form a complete circuit. The back of one cell is electrically connected to the front of the next. This process, known as stringing, is used to connect each row of the matrix known as a solar module. The interconnection is accomplished through the use of thin and flat strips of pre-tinned copper ribbon. The ribbon must be accurately aligned with a pre-printed stripe (bus bar) on the front of the cell. Misalignment of the ribbon relative to the bus bar causes power output losses and is not aesthetically pleasing. Therefore, ribbon alignment on the front of the solar cell is of great importance and has been a difficult challenge for many machines to accomplish. The difficulty is typically associated with the "flimsy" nature of the ribbon in its free state as well as camber problems with ribbon.

A general concept for aligning and fixing such a ribbon is disclosed in U.S. 2003/0127124 A1 which document is incorporated by reference here within in order to enable the skilled person being introduced in the technique.

In JP 2004-111464 A and in JP 2000-022188 A further background for the skilled person is disclosed.

Two general concepts exist on current Stringing machines from other suppliers.

The first concept holds the leading end of the ribbon(s), pulls it to length, cuts it, and moves it to position over the cells. With this approach, control of the trailing end of the ribbon is lost as soon as the ribbon is cut. If camber exists in the ribbon (which is common) then the alignment between the ribbon and the cell suffers.

The second concept grips both ends of the ribbon even after it is cut, but then lays the ribbon in a groove. A second "vacuum gripper" picks the ribbon from above and carries it to the cell(s). With this approach, picking ribbon with vacuum can be a problem and camber is also a problem. To avoid the camber problem, this company "stretches" the ribbon into yield before placing into the groove. This causes work hardening of the ribbon which has been linked to crystal damage of the cells after soldering.

SUMMARY OF THE INVENTION

One feature of the invention is avoiding the above identified problems when aligning and fixing a ribbon, i.e. the problem when camber exists in the ribbon (first concept) and the crystal damage of the cells by hardening of the ribbon which has been linked.

The feature of the invention is solved by total control of ribbon by holding both ends until control is transferred to the ribbon/cell hold down.

Ribbon straightness (camber) is no longer critical to the alignment on the front of the cell due to better ribbon control. This is a huge benefit because ribbon camber has been historically difficult for the ribbon suppliers to control. Fully programmable control of ribbon length, position, and tension is possible according to the present invention with no tooling change required for any of these parameters. The concept of the invention is capable of any number of ribbons with no change to concept, motions, or cycle time. Furthermore, the inventive concept is compatible with traditional front contact cells and also with the new back contact designs using straight ribbons.

The solution according to invention with the ribbon handling has addressed these problems by holding both ends of the ribbon until control can be transferred directly to the hold down system on the front of the cell. Both ends are held until the ribbon is cut loose from the spool and that does not occur until the hold down system has the ribbon "clamped" to the cell. This solution can handle any number of ribbons by multi-tooling the arms, but for simplicity the process is described hereby for a single ribbon. The prototype according to the preferred embodiment is designed for five ribbons and tooled for two. For multiple ribbons, the process is exactly the same except that a separate tooling set will exist for each ribbon.

Two tooling arms exist, each driven by a separate servo. The trailing arm (closest to the spool) contains a gripper and a shear mechanism. The leading arm contains only a gripper. On the trailing arm, the gripper and shear are mounted in such a way as to allow them to collapse together causing a small section of ribbon to protrude from the shear. This action provides material for the leading gripper to grip. Once this occurs, the leading gripper grips the ribbon and pulls out the required length. Once the feed length has been established, the trailing gripper also grips the ribbon. At this point, both ends of the ribbon are gripped and it is still continuous with the spool. The arms can now move further apart causing the ribbon to reach various levels of tension. This distance is fully programmable so that simple tension can be achieved or the material can be pulled to yield causing permanent straightness (and some work hardening). The two arms can also move in unison allowing the ribbon tension to remain constant while the ribbon is positioned to the desired location.

Once the ribbon is tensioned and in position, the entire ribbon feed assembly moves down to just above the solar cell. The hold down clamp lowers and holds the ribbon against the cell, and then the shear is activated thereby cutting the ribbon loose from the spool.

The most general attribute of this system according to the present invention is that the ribbon is held in tension at both ends while the hold down system takes control by clamping against the cell.

The features of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

DETAILED DESCRIPTION OF EXEMPLARY EMBODIMENTS

A preferred embodiment is detailed below as well as various exemplary embodiments.

Figure 1:
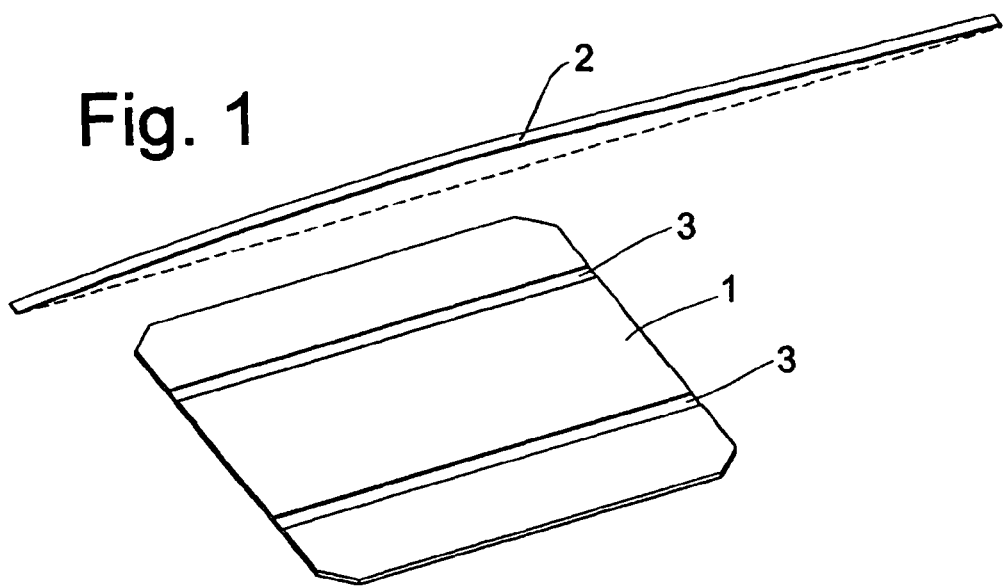
FIG. 1 is a perspective view of a solar cell with a ribbon prepared to be inserted in the respective groove.
Figure 2:
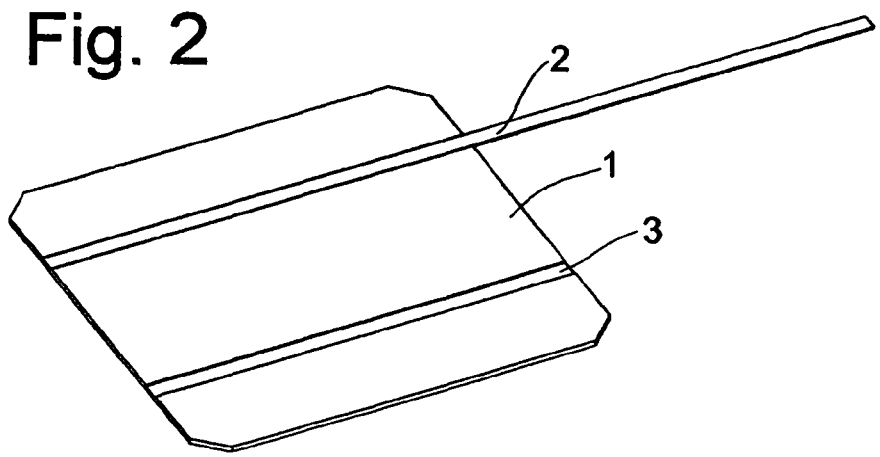
FIG. 2 is a perspective view according to the embodiment of FIG. 1 with the ribbon inserted the groove.

In FIG. 1 a solar cell 1 is prepared for the insertion of the ribbon 2 into the groove 3. The ribbon is a pre-tinned conductor belt which is fixed on the solar cell 1 by heating. Heating can be done either conventional or by radiation like laser light or by any other appropriate means. In order to have an optimal fixing the ribbon 2 should be really inserted in the grove 3.

Figure 3:
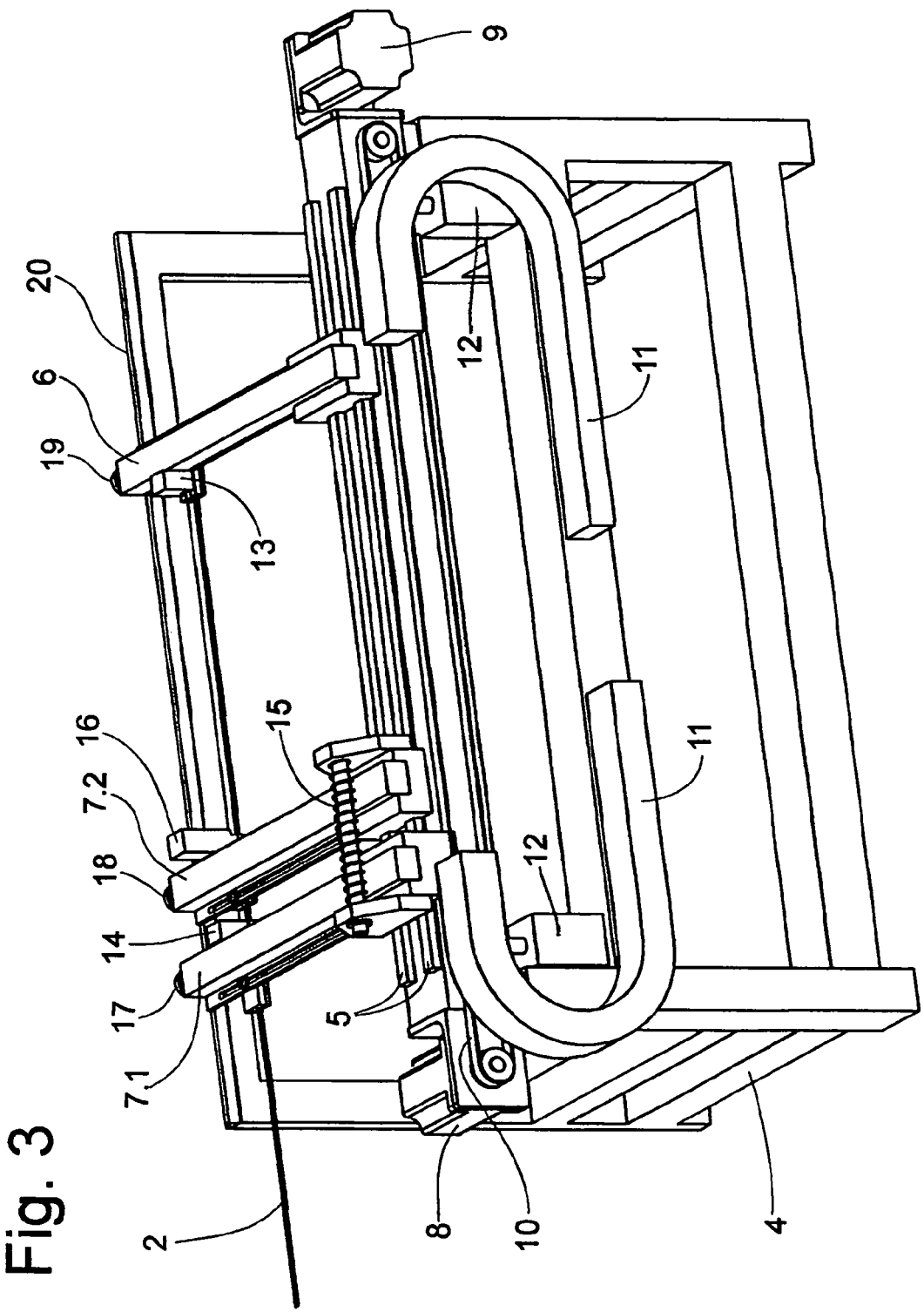
FIG. 3 is a perspective view of an apparatus for aligning and fixing a ribbon on a solar cell.
Figure 4:
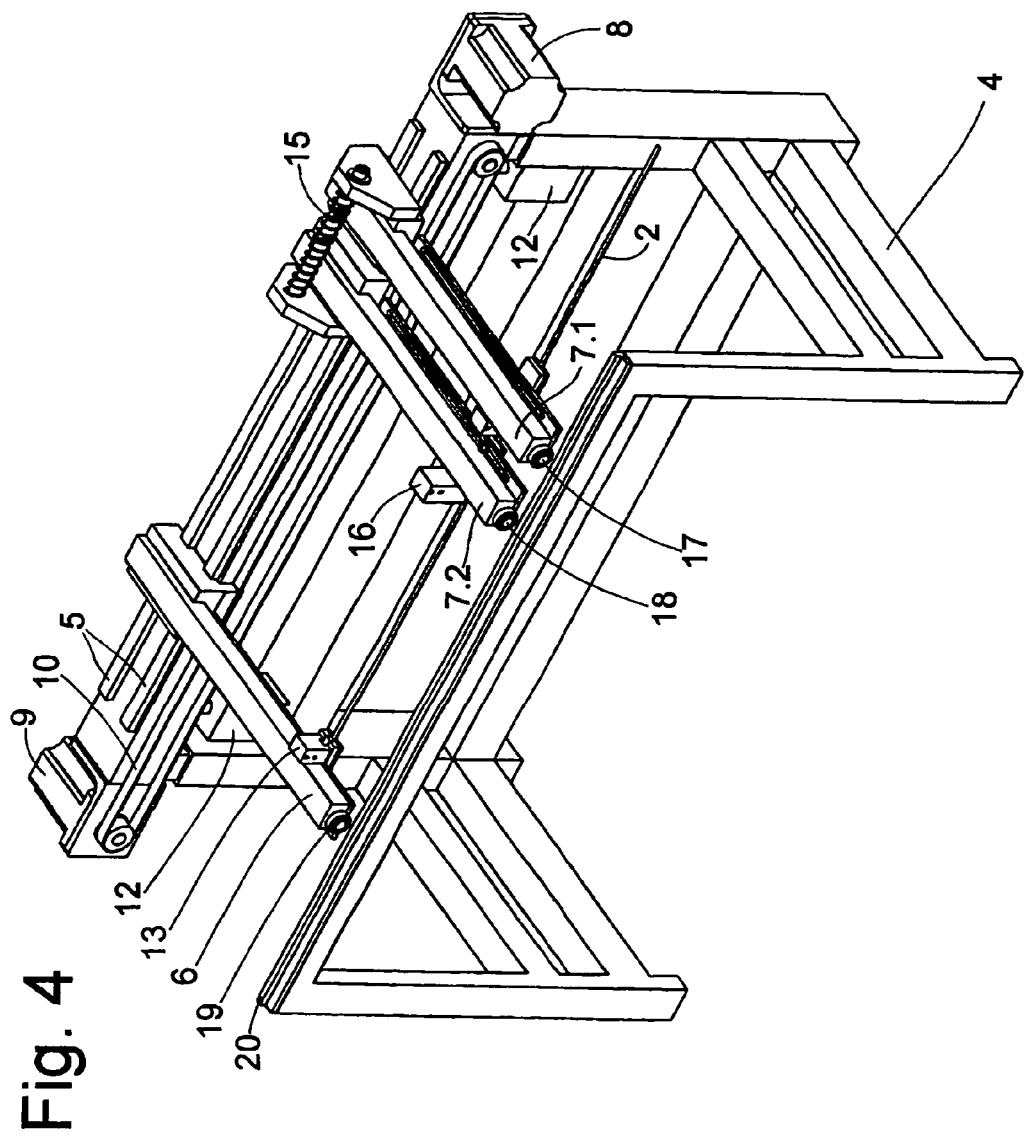
FIG. 4 is a perspective back view of the apparatus according to FIG. 3.

The apparatus according to FIG. 3 comprises a frame 4 with a linear guide 5, on which linear guide 5 a leading arm 6 and—according to the preferred embodiment—two trailing arms 7.1 and 7.2 are mounted. A servo motor 9 is provided to move the leading arm 6 along linear guide 5. Alternatively, the movements of the leading arm can be performed by a linear motor (not shown). A servo motor 8 is provided for the movement of the trailing arm 7.1 along linear guide 5. Each reference 10 refers to a belt and 11 refers to a chain for providing energy for moving the leading arm 6 and/or the trailing arm 7.1. As shown in FIGS. 4 and 6 through 9, leading arm 6 is connected to one of the (endless) belts 10 which can be driven in the longitudinal direction by means of motor 9, thus enabling leading arm 6 to be moved along linear guide 5. As indicated in FIG. 3, the trailing arm 7.1 is connected to one of the (endless) belts 10 which can be driven in the longitudinal direction by means of servo motor 8, thus enabling trailing arm 7.1 to be moved along linear guide 5. A linear stroke pneumatic cylinder 12 is provided for up/down movement of the linear guide 5, the motors 8 and 9, the leading arm 6 and the trailing arms 7.1 and 7.2.

Trailing arm 7.2 is coupled to trailing arm 7.1 by means of a spring 15 whose length can be changed in order to enable trailing arm 7.2 to be moved with respect to trailing arm 7.1 (thus changing the distance between trailing arms 7.2 and 7.1). Alternatively, instead of spring 15, a pneumatic cylinder (not shown) may be provided for the same purpose. Since trailing arm 7.2 is connected to trailing arm 7. 1, the trailing arms 7.1 and 7.2 are moved together, when moving trailing arm 7.1 by means of servo motor 8.

A gripper (clamp) 13 is arranged at the leading arm 6 and a gripper (clamp) 14 is arranged at the trailing arm 7.1. A shear means 16 is fixed at trailing arm 7.2. Since trailing arm 7.2 is coupled to trailing arm 7.1 by means of spring 15, shear means 16 is movably arranged with respect to trailing arm 7.1 and displaceable with respect to gripper 14.

Figure 5:
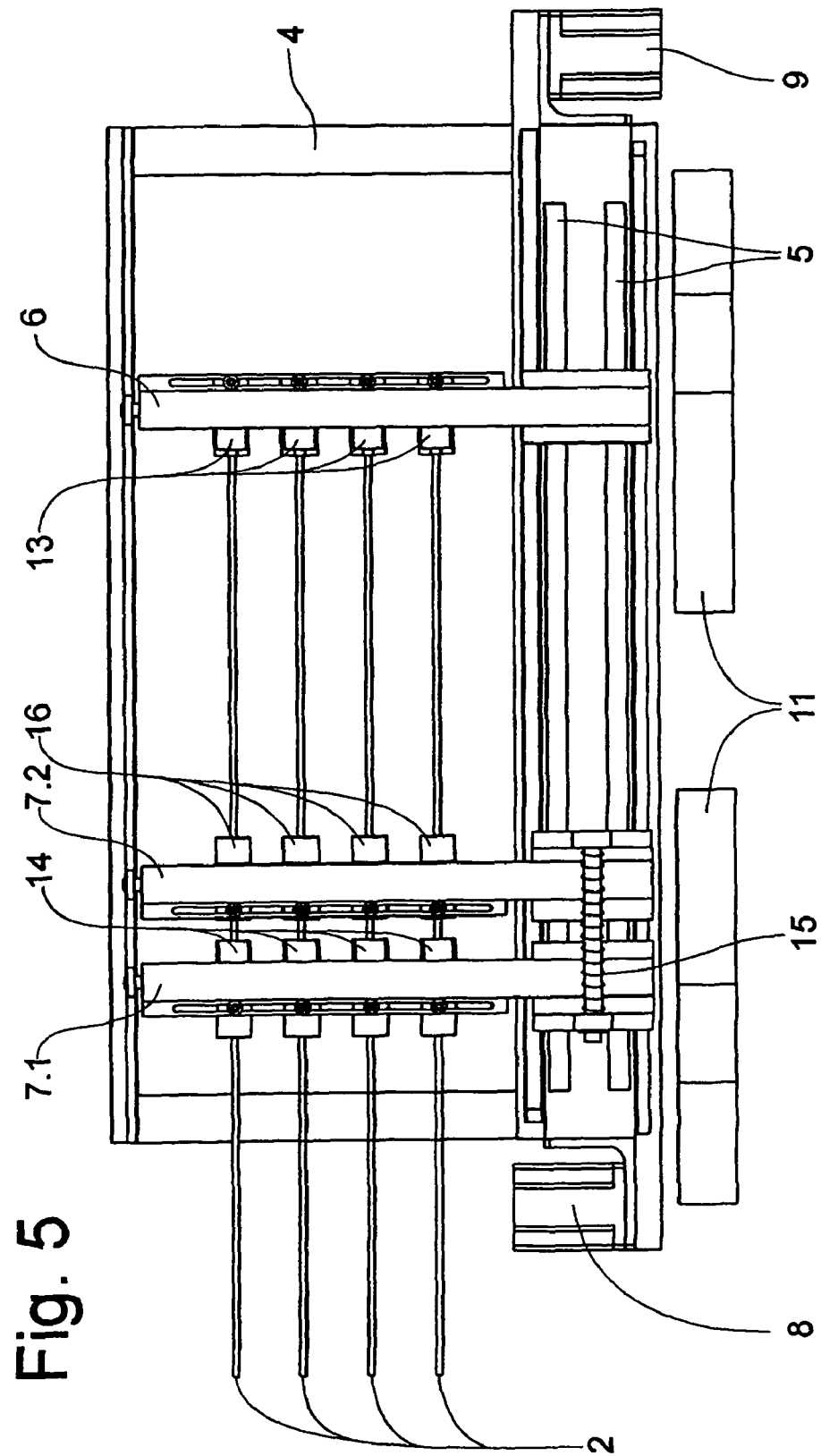
FIG. 5 is a top view of the apparatus according to FIG. 3.

The gripper (clamp) 13 of the leading arm 6 and the gripper (clamp) 14 of the trailing arm are arranged to grip the ribbon 2. The shear means 16 is provided to cut the ribbon 2. In the FIGS. 3 and 4 the respective means are shown just for a single ribbon in order to increase the intelligibility. In the preferred embodiment, however, the respective means are provided for a plurality of ribbons. In FIG. 5 such means are shown for 4 ribbons.

Figure 6:
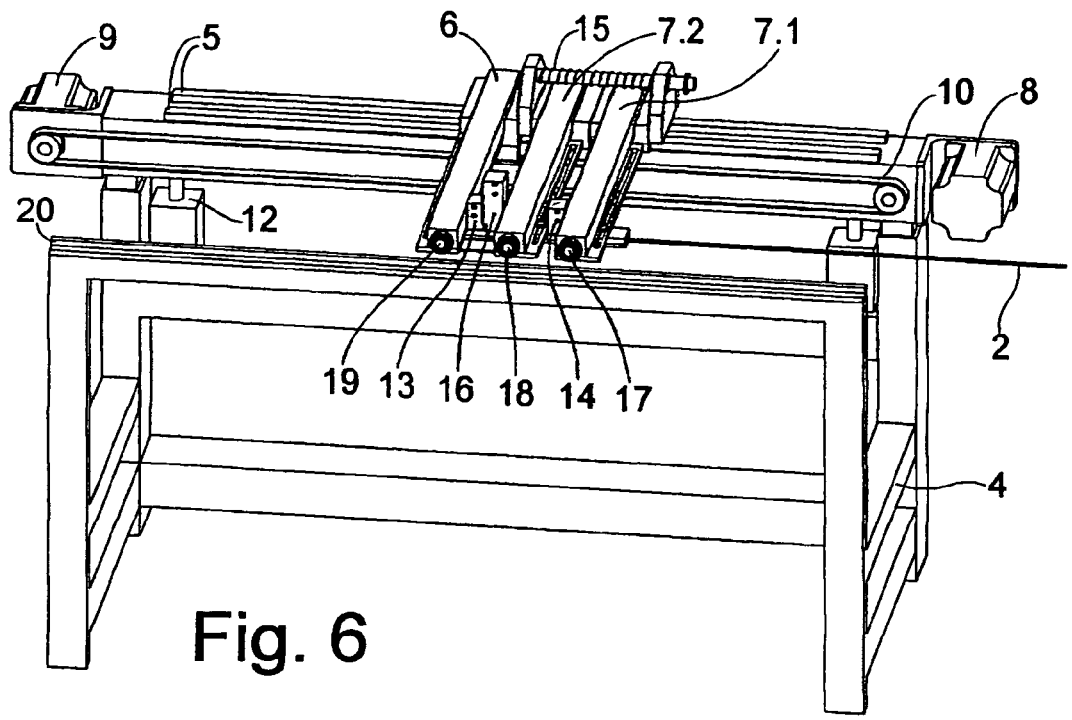
FIG. 6 shows a first step of the process according to the present invention performed with the apparatus of FIG. 3.
Figure 7:
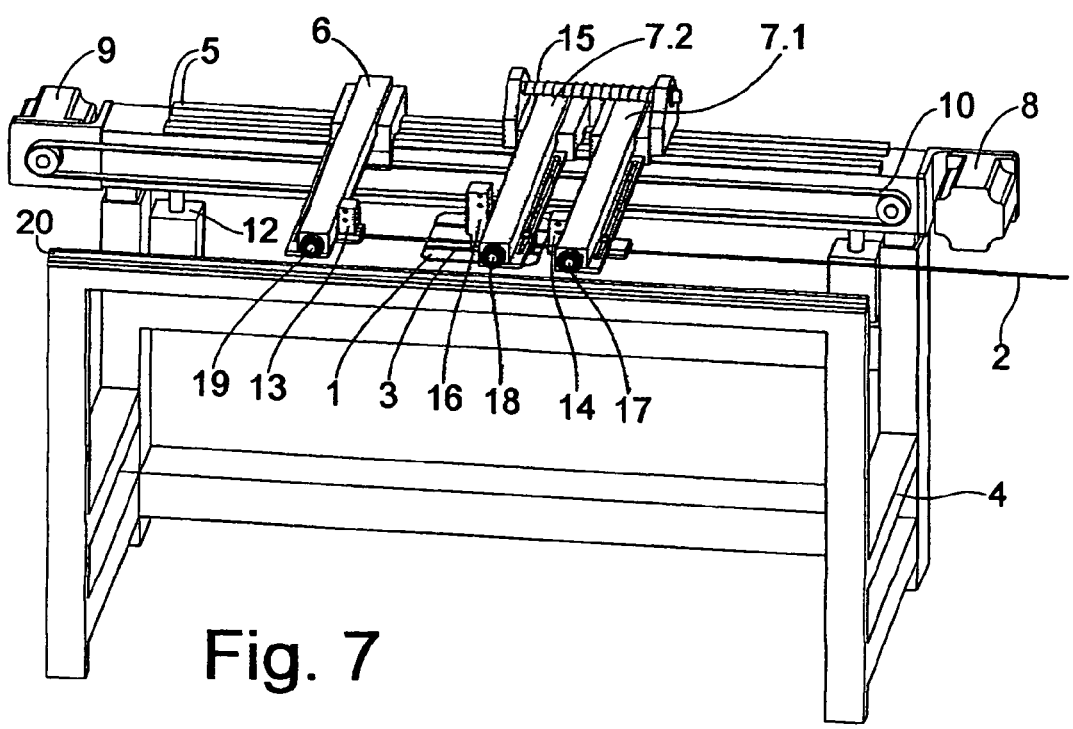
FIG. 7 shows a second step of the process according to the present invention performed with the apparatus of FIG. 3.
Figure 8:
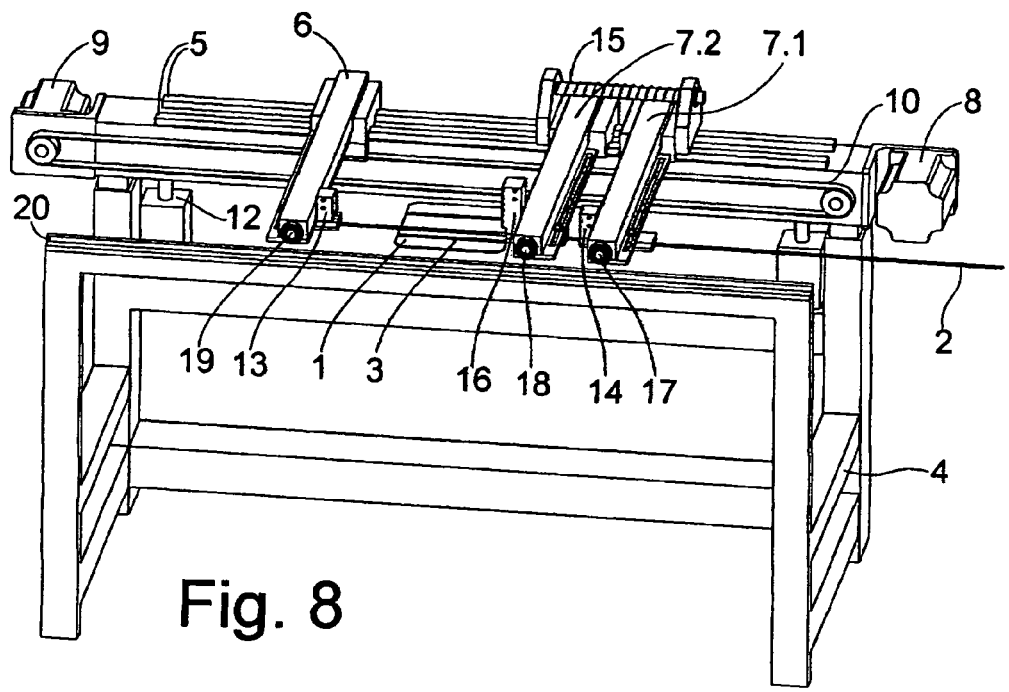
FIG. 8 shows a third step of the process according to the present invention performed with the apparatus of FIG. 3.
Figure 9:
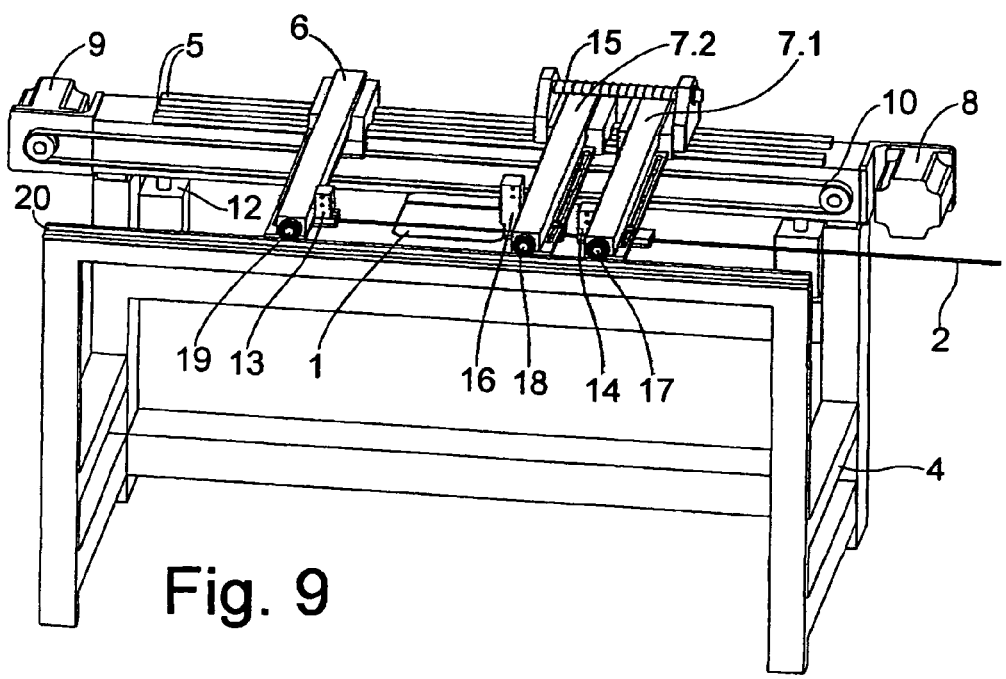
FIG. 9 shows a fourth step of the process according to the present invention performed with the apparatus of FIG. 3.

The method for using the apparatus according to FIGS. 2 to 5 is shown in FIGS. 6 to 9. At a first step of the procedure both arms, i.e. the leading arm 6 is moved with respect to the trailing arms 7.1 and 7.2 in such a way that trailing arm 7.2 is pushed towards trailing arm 7.1, thus reducing the distance between trailing arm 7.2 and trailing arm 7.1 and biasing spring 15 (FIG. 6). Thus, shear means 16 are moved with respect to gripper 14 of the trailing arm 7.1 causing a small section of the ribbon 2 to protrude from shear means 16. The gripper 13 of the leading arm 6 takes said protruding section of ribbon 2 (FIG. 6) and moves it to a predetermined position (FIG. 7). Meanwhile, the trailing arms 7.1 and 7.2 move to another predetermined position as well, whereas the gripper 14 of the trailing arm 7.1 is open (FIG. 8). Afterwards, the gripper 14 of the trailing arms is closed again (FIG. 8). The ribbon will be tightened applying the allowed tension by means of the servo motor 9. Underneath the ribbon 2, the solar cell 1 is depicted (FIGS. 7 through 9). Next, the whole means with all arms are lowered onto the level of the solar cell 1 (FIG. 9). Guiding wheels 17, 18, and 19 are provided in order to avoid vertical oscillations during lowering. A support section 20 is provided for the wheels 17, 18, and 19. After lowering, the ribbon 2 is connected with the solar cell 1 by the implementation of heat or radiation, i.e. laser radiation. The ribbon 2 is cut by the shear means 16, gripper 13 of the leading arm 6 is opened, and the solar cell 1 together with the ribbon 2 can be further transported.

In order to simplify the above arrangement, trailing arm 7.2 can be avoided by fixing shear means 16 at trailing arm 7.1. In the latter case, shear means 16 are preferably arranged at trailing arm 7.1 so that the shear means 16 are movable with respect to gripper means 14 of trailing arm 7.1. Thus, the method for aligning and fixing a ribbon onto a solar cell as described above can be applied accordingly.

What is claimed is:

1. An apparatus for aligning and fixing a ribbon onto a solar cell, said solar cell comprising a groove in which groove the ribbon fits in, said apparatus comprising
a frame,
a leading arm movably mounted on a linear guide being arranged on said frame,
a trailing arm movably mounted on the linear guide being arranged on said frame,
moving means for an upward and downward movement of said linear guide,
shear means for cutting said ribbon, wherein said leading arm and said trailing arm each comprises at least one gripper means for gripping said ribbon, and wherein said gripper means are provided to apply a predetermined longitudinal tension to said ribbon, guiding means to avoid vertical oscillations during the movement by said moving means for an upward and downward movement, and a support section for said guiding means.

2. The apparatus according to claim 1, wherein said shear means are arranged at one of the arms in such a way that said shear means are movable with respect to the gripper means of the same arm.

* * * * *